United States Patent
Jeng et al.

(10) Patent No.: US 7,179,708 B2
(45) Date of Patent: Feb. 20, 2007

(54) PROCESS FOR FABRICATING NON-VOLATILE MEMORY BY TILT-ANGLE ION IMPLANTATION

(75) Inventors: Erik S. Jeng, Taipei (TW); Wu-Ching Chou, Jungli (TW); Li-Kang Wu, Kaohsiung (TW); Chien-Chen Li, Hualien (TW)

(73) Assignee: Chung Yuan Christian University, Jungli (TW)

( * ) Notice: Subject to any disclaimer, the term of this patent is extended or adjusted under 35 U.S.C. 154(b) by 55 days.

(21) Appl. No.: 10/891,373

(22) Filed: Jul. 14, 2004

(65) Prior Publication Data
US 2006/0019441 A1   Jan. 26, 2006

(51) Int. Cl.
*H01L 21/336* (2006.01)
(52) U.S. Cl. ........................... 438/257; 438/739
(58) Field of Classification Search ............ 438/257
See application file for complete search history.

(56) References Cited
U.S. PATENT DOCUMENTS 5,783,457 A * 7/1998 Hsu ..................... 438/302
6,011,725 A   1/2000 Eitan
6,236,085 B1 * 5/2001 Kawaguchi et al. ........ 257/345

* cited by examiner

*Primary Examiner*—Andy Nuynh
*Assistant Examiner*—Earl Taylor
(74) *Attorney, Agent, or Firm*—Apex Juris, pllc; Tracy M Heims

(57) ABSTRACT

A process for fabricating non-volatile memory by tilt-angle ion implantation comprises essentially the steps of implanting sideling within a nitride dielectric layer heterogeneous elements such as, for example, Ge, Si, N2, O2, and the like, for forming traps capable of capturing more electrons within the nitride dielectric layer such that electrons can be prevented from binding together as the operation time increased; etching off both ends of the original upper and underlying oxide layers to reduce the structural destruction caused by the implantation of heterogeneous elements; and finally, depositing an oxide gate interstitial wall to eradicate electron loss and hence promote the reliability of the device.

10 Claims, 3 Drawing Sheets

PROCESS FOR FABRICATING NON-VOLATILE MEMORY BY TILT-ANGLE ION IMPLANTATION

BACKGROUND OF THE INVENTION

1. Field of the Invention

The invention relates to a process for fabricating non-volatile memory by tilt-angle ion implantation, and in particular, to a process for fabricating non-volatile memory by tilt-angle ion implantation characterized in that, in addition to increase the retention time of the memory, it can avoid merge of electrons due to prolonged operation.

2. Description of the Prior Art

Recently, the role of the flash memory device in the development and fabrication of the semiconductor device has becomes more and more important. As portable electronic products increasingly prevail, the modification and portability of data has a pivotal function in these products, and accordingly, a flash memory has its competitive advantage over other devices.

Referring to FIGS. 1 and 2, a schematic structure of a conventional non-volatile memory is shown to be composed of two different structures: a floating gate device 1 (FIG. 1) and a charge trapping device 2 (FIG. 2).

As shown in FIG. 1, the manner of memory storage of the floating gate device 1 consists of storing electrons on a floating gate 11 made of polysilicon. Polysilicon is a good electron conducting material such that, after capturing electrons on the floating gate 11, electrons can distribute uniformly thereon, and as a result, the shift of the threshold voltage thus generated can be used for determining the action of memory. However, the floating gate device 1 can store only one bit so that its production cost is correspondingly increased and hence exhibit substantially no economical benefit.

Referring to FIG. 2, the charge-trapping device 2 is composed of two or three layers of insulting materials stacked beneath the gate G, and wherein one of these layers has a high deep-level trap density, which is an insulating material capable of capturing more electrons. This material includes silicon nitride 22, Si3N4, or alumina, Al2O3, which can store charge. Unfortunately, the charge trapping device 2 shows a big problem on retention time, because oxides 21 in the underlying layer might capture positive charge therein during programming that may lower the energy barrier of the underlying oxide layer 21 and as a result, electrons captured in the silicon nitride 22 might penetrate readily through the underlying oxide layer 21. This would cause loss of electrons stored therein and consequently reduces the retention time. Further, electrons captured in both ends of silicon nitride 22 will cumulate and bind together gradually as the operation time increases. Under this circumstance, the original meaning of two-bit storage will be deviated naturally. This mechanism is the biggest problem encountered in the current 2-bit storage.

Accordingly, it is apparent that the conventional device has many disadvantages and is not a perfect design such that it is desirable to be improved.

In view of the above-described disadvantages associated with the prior art non-volatile memory, the inventor has devoted to improve and innovate, and, after studying intensively for many years, developed successfully the process for fabricating non-volatile memory by tilt-angle ion implantation according to the invention.

SUMMARY OF THE INVENTION

One object of the invention is to provide a process for fabricating non-volatile memory by tilt-angle ion implantation characterized in that two bits can be stored in a single cell to achieve the result of lowering production cost.

Another object of the invention is to provide a process for fabricating non-volatile memory by tilt-angle ion implantation characterized in that ions of heterogeneous elements are implanted sideling within the nitride dielectric materials in a manner that the nitride dielectric material forms traps to capture electrons more easily that renders merge together of electrons not increased easily along with the operation time so as to achieve effects of good programming and erasing.

Still another object of the invention is to provide a process for fabricating non-volatile memory by tilt-angle ion implantation characterized in that both ends of the upper and lower oxide layers are etched off by the step of etching to reduce the structural destruction of oxide layers due to implantation of heterogeneous elements to achieve the purpose of the promotion of the reliability of devices.

The process for fabricating non-volatile memory by tilt-angle ion implantation according to the invention that can achieve the above-described objects comprises essentially of implanting sideling within the nitride layer that can capture electrons of heterogeneous elements such as Ge, Si, N2, O2, and the like, for the purpose of giving the nitride an electron trap density deeper than the original one such that electrons can be retained steadily within the nitride without loss; etching off the oxide layer that is damaged due to the implantation, depositing an interstitial wall for the oxide layer to solve effectively the effect on the device caused by the implantation of the heterogeneous element and thereby to improve issues of retention time of bit merge occurred to the current silicon-oxygen-nitrogen-oxygen-silicon compound (SONOS).

These features and advantages of the present invention will be fully understood and appreciated from the following detailed description of the accompanying Drawings.

DETAILED DESCRIPTION OF THE PREFERRED EMBODIMENT

Figure 1:
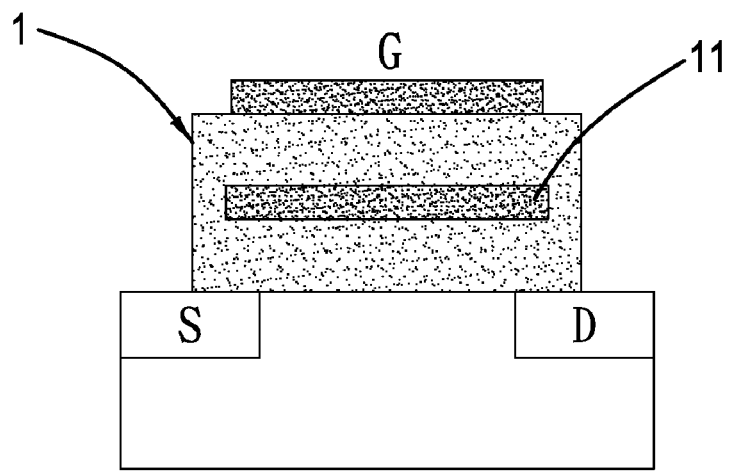
FIG. 1 is a diagram showing the structure of a floating gate device in a conventional non-volatile memory.
Figure 2:
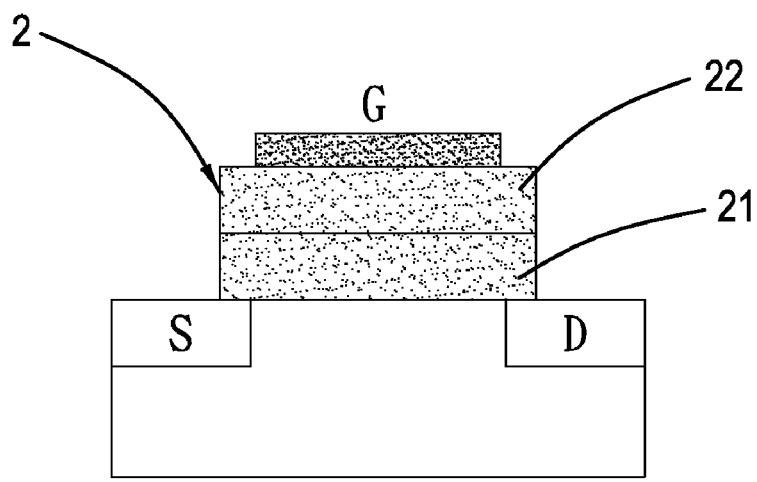
FIG. 2 is a diagram showing the charge capturing device in a conventional non-volatile memory.
Figure 3:
FIGS. 3A–3F is a flow chart showing steps involved in the process for fabricating non-volatile memory by tilt-angle ion implantation according to the invention.
Figure 3:
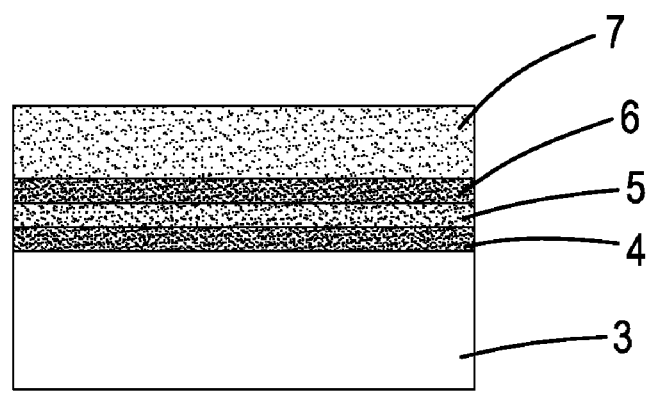
Figure 3:
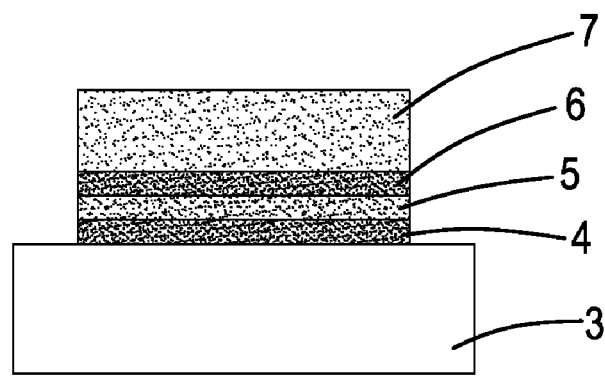
Figure 3:
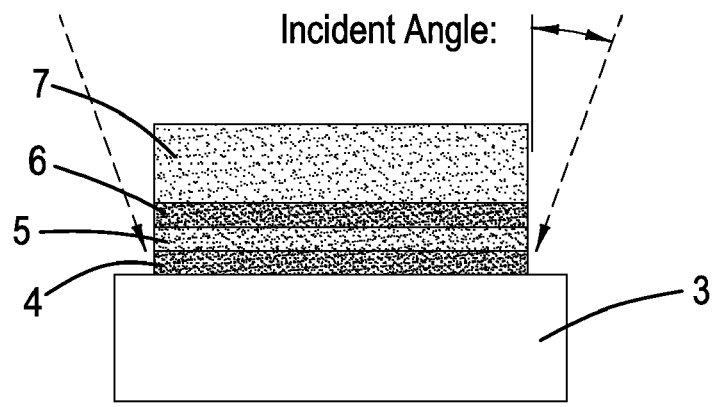
Figure 3:
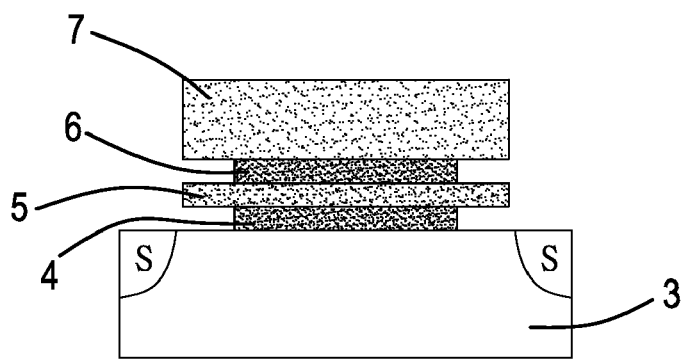
Figure 3:
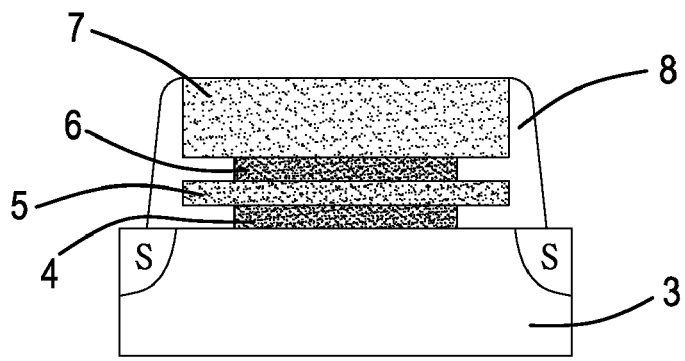

Referring to FIGS. 3A–3F, a process for fabricating non-volatile memory by tilt-angle ion implantation according to the invention comprises the steps of:

step 1: providing a wafer substrate 3 (FIG. 3A);

step 2: depositing over the wafer substrate 3 successively a first oxide layer 4, nitride layer 5, an upper second oxide layer 6, and a gate 7, in a manner that a gate dielectric layer (oxide-nitride-oxide (ONO)) is formed over the wafer substrate 3 (FIG. 3B), wherein said nitride layer 5 can store two bits at the same time; said first and second oxide layers 4, 6 may be silicon oxide; said gate layer 7 is a polysilicon layer; and said nitride layer 5 is silicon nitride;

step 3: forming gate pattern by photoresist developing, and removing both ends of the gate dielectric layer by directional etching to expose said first oxide layer or said substrate (FIG. 3C);

Step 4: removing the photoresist and using tilt-angle ion implantation to implant within said nitride layer 5 heterogeneous elements such as ions of Ge, Si, N2, O2, N, O, NO, N2O, NO2 and the like, or combinations thereof to generate a deeper electron trap density such that electrons can be stored in said nitride layer 5 more stably and hence extend the retention time and address the problem of bit merge (FIG. 3D); wherein the tilt angle for said ion implantation should be more than 10 degrees and less than 90 degrees;

Step 5: selectively removing damaged parts of both ends of said upper second oxide layer 6 and said first oxide layer 4 by wet etching, respectively, to reduce the structural destruction of said upper second oxide layer 6 and said lower second oxide layer 4 due to the tilt implantation of heterogeneous elements to prevent loss of electrons via said upper second oxide layer 6 and said lower second oxide layer 4 (FIG. 3E).

step 6: finally, depositing a third interstitial oxide wall layer 8 to prevent loss of electrons and hence enhancing the reliability of said device (FIG. 3F); wherein said third interstitial oxide wall layer 8 may be silicon oxide.

A non-volatile memory according to the invention can be formed through the process described above.

Further, since the electron trap density of the nitride layer 5 is increased by heterogeneous element implantation and the minimal value of these heterogeneous elements is their atomic size (about 0.3 micron), the resulting non-volatile memory is naturally a nanoscale non-volatile memory.

The process for fabricating non-volatile memory by tilt-angle ion implantation provided according to the invention has following advantages over conventional techniques:

1. Two bits can be stored on a single cell according to the process of the invention thereby lowering production costs.

2. According to the invention, heterogeneous elements are implanted sideling within the nitride dielectric layer such that traps capturing more electrons are formed within said nitride dielectric layer, electron binding will not increase and hence bind together easily with the operation time, and thereby good effects on programming and erasing can be obtained.

3. The process according to the invention comprises etching off both ends of the original upper and underlying oxide layers by a step of wet etching to reduce the structural destruction of the oxide layer caused by the implantation of heterogeneous elements to improve the reliability of the device.

While the invention is described above with reference to its embodiments, it is understood that these embodiments are not intended to limit the scope of the invention.

Therefore, many changes and modification in the above described embodiment of the invention can, of course, be carried out without departing from the scope thereof. Accordingly, to promote the progress in science and the useful arts, the invention is disclosed and is intended to be limited only by the scope of the appended claims.

REFERENCES

1. Marc A. Kastner in Physics Today, January 1993, page 24*.
2. Taro Osabe, Tomoyuki Ishii, Toshiyuki Mine, Fumio Murai, and Kazuo Yano, "A Single-Electron Shut-Off Transistor for a Scalable Sub-0.1-£gm Memory," IEDM$_i$|00, 305, 2000.
3. J. De Blauwe, M. Ostraat*, M. L. Green, G. Weber, T. Sorsch, A. Kerber, F. Klemens, R. Cirelli, E. Ferry, J. L. Grazul, F. Baumann, Y. Kim, W. Mansfield, J. Bude, J. T. C. Lee, S. J. Hillenius, R. C. Flagan *, and H. A. Atwater *, "A novel, aerosol-nanocrystal floating-gate device for non-volatile memory applications," IEDM$_i$|00, 683, 2000.
4. A. Fernandes a, B. DeSalvo a , T. Baron b, J. F. Damlencourt a, A. M. Papon a, D. Lafond a, D. Mariolle a, B. Guillaumot c, P. Besson c, P. Masson b, G. Ghibaudo d, G. Pananakakis d, F. Martin a and S. Haukka e, "Memory Characteristics of Si Quantum Dot Devices with SiO2/ALD Al2O3 Tunneling Dielectrics," IEDM session Jul. 4, 2001.
5. G. Wakefield, P. J. Dobson, J. L. Hutchison, Y. Y. Foo, "Charge injection into porous silicon electroluminescent devices," Materials Science and Engineering G B, Volume$_i$G543, Issue$_i$G1–3, Feb. 27, 1998, pp. 141–145.
6. Shingubara, S.; Okino, O.; Nakaso, K.; Sakaue, H.; Takahagi, T. "Fabrication of nano holes array on Si substrate using anodically oxidized aluminum etching mask," Microprocesses and Nanotechnology '99. 1999 International, 1999, Page(s): 124–125.
7. Y. R. Cheng, J. Y. Mou, and H. P. Lin, "Median Porosity Molecular Sieve MCM-41," Chemistry (The Chinese CHEM. SOC., Taipei) Setp., 1998 vol. 56, No. 3 pp. 197–207.
8. Zongtao Zhang, Sheng Dai, Xudong Fan, Douglas A. Blom, Stephen J. Pennycook, and Yen_Wei, "Controlled Synthesis of CdS Nanoparticles Inside Ordered Mesoporous Silica Using Ion-Exchange Reaction," J. Phys. Chem. B. Vol. 105, No. 29, 2001.

PATENTS

1. U.S. Pat. No. 6,011,725: Two Bit Non-Volatile Electrically Erasable And Programmable Semiconductor Memory Cell Utilizing Asymmetrical Charge Trapping.

What is claimed is:

1. A process for fabricating non-volatile memory by tilt-angle ion implantation, comprising:

step 1: providing a wafer substrate;

step 2: depositing over said wafer substrate successively a first oxide layer, a nitride layer, a second oxide layer, and a gate in a manner that a gate dielectric is formed over said wafer substrate;

step 3: forming a gate pattern by photoresist developing, and removing both ends of said gate dielectric layer by directional etching to expose said first oxide layer or said substrate;

step 4: removing the photoresist and using tilt-angle ion implantation to implant said ions within said nitride layer thereby generating a deeper electron trap density such that electrons can be stored in said nitride layer more stably;

step 5: removing damaged parts of both ends of said first oxide layer and said second oxide layer, respectively, by a selective wet etching to reduce the structural destruction of said first oxide and said second oxide layer due to the tilt angle implantation of heterogeneous elements to prevent electron loss via said first oxide layer and said second oxide layer;

step 6: depositing a third interstitial oxide wall layer to prevent electron loss and hence enhancing the reliability of said device;

whereby a non-volatile memory is fabricated.

2. The process for fabricating non-volatile memory by tilt-angle ion implantation as recited in claim 1, wherein said nitride layer in the step 2 comprises silicon nitride.

3. The process for fabricating non-volatile memory by tilt-angle ion implantation as recited in claim 1, wherein said heterogeneous elements in the step 5 is selected from the group consisting of ions of Ge, Si, N2, O2, N, O, NO, N20, NO2, as well as combinations thereof.

4. The process for fabricating non-volatile memory by tilt-angle ion implantation as recited in claim 1, wherein an incident angle of said ion implantation is more than 10 degrees.

5. The process for fabricating non-volatile memory by tilt-angle ion implantation as recited in claim 1, wherein an incident angle of said ion implantation is less than 90 degrees.

6. The process for fabricating non-volatile memory by tilt-angle ion implantation as recited in claim 1, wherein said first oxide layer in the step 2 comprises silicon oxide.

7. The process for fabricating non-volatile memory by tilt-angle ion implantation as recited in claim 1, wherein said second oxide layer in the step 2 comprises silicon oxide.

8. The process for fabricating non-volatile memory by tilt-angle ion implantation as recited in claim 1, wherein said third oxide layer in the step 6 comprises silicon oxide.

9. The process for fabricating non-volatile memory by tilt-angle ion implantation as recited in claim 1, wherein said gate in the step 2 comprises a polysilicon layer.

10. The process for fabricating non-volatile memory by tilt-angle ion implantation as recited in claim 9, wherein said gate is composed of a metal silicide and a polysilicon.

* * * * *